United States Patent [19]

Nath

[11] Patent Number: 4,514,437
[45] Date of Patent: Apr. 30, 1985

[54] APPARATUS FOR PLASMA ASSISTED EVAPORATION OF THIN FILMS AND CORRESPONDING METHOD OF DEPOSITION

[75] Inventor: Prem Nath, Rochester, Mich.

[73] Assignee: Energy Conversion Devices, Inc., Troy, Mich.

[21] Appl. No.: 606,014

[22] Filed: May 2, 1984

[51] Int. Cl.³ .............................................. B05D 3/06
[52] U.S. Cl. .................................. 427/39; 118/50.1; 118/718; 118/723; 427/42; 427/87; 427/93
[58] Field of Search ............................ 427/38, 39, 42; 118/50.1, 723, 718

[56] References Cited

U.S. PATENT DOCUMENTS

| | | | |
|---|---|---|---|
| 4,107,350 | 8/1978 | Berg et al. | 427/38 |
| 4,226,082 | 10/1980 | Nishida | 427/38 |
| 4,336,277 | 6/1982 | Bunshah et al. | 427/38 |
| 4,361,114 | 11/1982 | Gurev | 427/39 |
| 4,379,943 | 4/1983 | Yans et al. | 427/39 |

OTHER PUBLICATIONS

Paton et al., *Thin Solid Films*, vol. 54, (1978), pp. 1-8.

Primary Examiner—John H. Newsome
Attorney, Agent, or Firm—Marvin S. Siskind; Ronald W. Citkowski

[57] ABSTRACT

An improved method of and apparatus for depositing thin films, such as indium tin oxide, onto substrates, which deposition comprises one step in the fabrication of electronic, semiconductor and photovoltaic devices. The method includes the novel steps of combining the use of (1) an electron beam to vaporize a source of solid material, and (2) electromagnetic energy to provide an ionizable plasma from reactant gases. By passing the vaporized solid material through the plasma, it is activated prior to the deposition thereof onto the substrate. In this manner, the solid material and the reactant gases are excited to facilitate their interaction prior to the deposition of the newly formed compound onto the substrate.

29 Claims, 4 Drawing Figures

APPARATUS FOR PLASMA ASSISTED EVAPORATION OF THIN FILMS AND CORRESPONDING METHOD OF DEPOSITION

FIELD OF THE INVENTION

The present invention relates generally to an improved method and apparatus for depositing thin films and more particularly to a plasma assisted electron-beam evaporation process for efficiently depositing a thin film onto a substrate. This invention has specific utility in the deposition of thin film transparent oxides for use in the production of semiconductor devices.

BACKGROUND OF THE INVENTION

In one preferred embodiment, the present invention relates to an improved method of and apparatus for depositing thin films, such as electrically conductive, light transmissive films, barrier layer films, passivating films, etc., via a process which is easy to control and which avoids damage to the substrate from the depositing species. In particular, the deposition of such thin films represents one step in the manufacture of amorphous semiconductor devices, such as photoreceptive and photovoltaic devices. Furthermore, the instant invention allows for reliable control of the deposition process, through a wide range of previously unattainable deposition rates. Other preferred embodiments of the present invention, disclosed herein, deal with the deposition of thin films onto the surface of metal, glass, plastic, or even low melting point substrates.

Vacuum evaporation techniques represent a first attractive process for the fabrication of the thin film layers such as those described hereinabove, insofar as vacuum evaporation technology is simple to implement, economical, and may be performed at high deposition rates. However, such techniques have several limitations which have heretofore prevented the use thereof in a still wider variety of applications. In conventional vacuum evaporation processes, the material to be deposited is heated in a vacuum, thereby vaporizing same. The vaporized material is then condensed onto a substrate maintained in close proximity thereto, thus forming a thin film. Full utilization of this technique is limited by the facts that (1) many of the materials employed to deposit thin films have relatively low vapor pressures, thus requiring high temperatures for the evaporation thereof, and (2) many precursor compounds (the material to be deposited) decompose or disproportionate when evaporated, thereby resulting in the deposition of thin films having a composition differing from that of the evaporated precursor compounds. For these reasons, reactive evaporation processes, and especially activated reactive evaporation processes, are favored for the preparation of specially configured thin films fabricated from specific precursor compounds.

In reactive evaporation processes, thermally generated vapors of the precursor material to be deposited, which vapors emanate from a source of the precursor material, such as a heated crucible, react with the residual atmosphere specifically maintained in an evaporation apparatus to produce a molecular species which is then condensed onto a proximately disposed substrate so as to deposit a thin film layer thereupon. In this manner, the amount of disproportionation is limited, and vapors of difficult to evaporate materials may be generated. For example, a mixture of indium metal and tin metal may be heated at reduced pressure in an evaporation apparatus having a specifically maintained residual atmosphere of oxygen therein to condense a thin film of indium tin oxide onto a proximately disposed substrate. The deposition of said indium tin oxide has apparent utility as a transparent electrical conductor for semiconductor devices. Similarly, the vapors of titanium metal may be heated and reacted in a residual ammonia atmosphere to deposit a thin film of titanium nitride onto a substrate. However, major shortcomings of reactive evaporation processes exist due to the fact that the vapor phase reaction rates of many precursor materials are relatively slow, and, consequently, processes which rely upon these reaction rates will exhibit inherently low deposition rates.

The reaction rate of the vaporized precursor material and the residual atmosphere of gas in the evaporation chamber may be accelerated through the use of an activated evaporation process. One such activated evaporation process is disclosed in U.S. Pat. No. 4,336,277 of Bunshah and Nath entitled "Transparent Electrical Conducting Films By Activated Reactive Evaporation"; and further described by Bunshah and Nath in a publication entitled "Preparation of $In_2O_3$ and Tin-doped $In_2O_3$ Films by a Novel Activated Reactive Evaporation Technique", published in THIN SOLID FILMS, Vol. 69 (1980). As disclosed in and taught by the foregoing patent and publication, resistive heating is employed to evaporate indium and tin metals, while an electron flux is provided from a thermionic emitter to generate the activating ionized plasma. However, in the disclosed process, pressures in the range of $10^{-4}$ torr are required to provide a sufficient number of metal atoms and gas atom collisions with the plasma ions to accomplish the requisite metals-oxygen reaction. Further, in the described Bunshah and Nath process it is essential that (1) an inert gas such as argon be introduced into and be primarily ionized within the plasma zone to aid in the secondary ionization of the oxygen atoms, and (2) a magnetic field be employed to move the ions through the plasma zone in a helical path for increasing the length of time the ions remain therein, thereby increasing the number of possible ion collisions with the oxygen atoms and metal atoms.

Another activated reactive evaporation process is disclosed in U.S. Pat. application Ser. No. 448,139 of Nath filed Dec. 9, 1982, and entitled "Apparatus For And Method Of Depositing A Highly Conductive, Highly Transmissive Film," which application is assigned to the assignee of the instant patent application, and the disclosure of which is incorporated herein by reference. In the Nath patent application, a resistance heated crucible is employed to generate vapors of a solid precursor metallic material, and a radio frequency generated plasma is employed to activate the metal vapors, such as indium and tin, and promote the reaction thereof with a gas, such as oxygen, so as to deposit a thin film of, in the preferred embodiment, indium tin oxide onto the substrate. It is to be noted that the method disclosed in the activated reactive evaporation process of Bunshah and Nath, and the method disclosed in the r.f. plasma activated evaporation process of Nath are limited to the use of resistance heated crucibles to generate vapors of the solid material. While many solid precursor materials may be successfully evaporated by means of resistance heating, other precursor materials have melting points sufficiently high that resistance heating: (1) fails to evaporate those precursor materials at all, (2) fails to produce enough vapors from those precursor materials to result in a practical rate of deposition, or (3) which would effectively vaporize the precursor materials would simultaneously deteriously affect, for instance, a low melting point substrate, or a body of semiconductor material deposited on a substrate.

In contrast thereto, electron beam heating may be advantageously employed to vaporize high melting point materials. In electron beam evaporation, an electron source, such as a thermionic emitter, provides a focused energetic beam of electrons which is directed by, for instance, an electromagnetic field, to impinge upon, and thereby heat the precursor material so as to effect the evaporation thereof. As a further desirable feature, note that electron beam evaporation is a process which is easily controlled, since the electron beam may be rapidly switched or modulated. Therefore, an electron beam evaporation process is not only specifically well suited for the evaporation of high melting point materials such as refractory materials, but also, because of the fine degree of control available, is quite useful for evaporating a wide variety of low melting point materials.

The utility of such electron beam initiated reactive evaporation processes for depositing thin films should thus be apparent from the foregoing discussion. One such process, currently in limited use, relies upon the ability of an energetic beam of electrons impinging upon the surface of the precursor material being evaporated to produce secondary electrons, that is to say, to eject electrons from the precursor material. It is thereby possible, by positioning a positively charged electrode in close proximity to the electron beam heated precursor material, to trap the secondary electrons in sufficient proximity to the vaporized precursor material that the secondary electrons will activate the vaporized material in the manner previously described. This type of activated reactive evaporation process is well known to those skilled in the art; see, for example, "Processes of the Activated Reactive Evaporation Type and Their Tribological Applications" published by Bunshah in *THIN SOLID FILMS*, Vol. 107, No. 1, Page 26 (1983). A noteworthy shortcoming of activated reactive evaporation processes which rely upon secondary electron emissions to activate the vapors is the dependency of those processes upon those secondary electrons, and those processes are therefore of limited utility. The formation of secondary electrons will depend upon the type of precursor material being evaporated, the temperature of the precursor material during the evaporation process, as well as the rate of evaporation of the precursor material. Low melting point precursor materials, such as the indium tin alloy commonly employed to form indium tin oxide films, evaporate at relatively low temperatures, and accordingly, provide only a limited number of secondary electrons from which to activate the vapors of the precursor materials. Further, even high melting point precursor materials, such as titanium and chromium, which have low evaporation rates, provide only a limited number of secondary electrons. For these reasons, known methods of activated reactive evaporation are not well adapted for (1) low rate depositions, or (2) use when low melting point precursor materials are being evaporated.

Accordingly, there still exists a need for an activated reactive evaporation process employing an electron beam to vaporize a source of precursor material, which process does not rely upon secondary electron emissions for the activation of the vaporized precursor material. According to the principles of the instant invention, radio frequency energy may be advantageously employed to form an activating ionized plasma in a reactive evaporation system. Radio frequency activation may be combined with an electron beam source to vaporize the precursor materials to provide an activated reactive evaporation system which is not dependent upon the emission of secondary electrons for the formation and maintenance of the activating plasma, and which is specifically adapted to deposit a wide variety of precursor materials at varying deposition rates.

U.S. Pat. Ser. No. 4,361,114 of Gurev, entitled, "Method And Apparatus For Forming Thin Film Oxide Layers Using Reactive Evaporation Techniques," discloses a system for the preparation of thin films of indium tin oxide materials. According to the method described by Gurev, oxygen, which is adapted to ultimately react with the vapors of indium and tin, is ionized by a radio frequency signal at its point of introduction into the system, thereby promoting the subsequent reaction thereof with the vaporized indium and tin. It is to be noted that in the system of Gurev, radio frequency energy is used to excite only the reactant gas, oxygen, at a point remote and isolated from the point at which the vapors of the solid precursor materials are generated. Accordingly, only the reactant gas is activated by the radio frequency energy field, and the reaction rates, and the subsequent deposition rates, are lower than they would be if both species were activated. Because the apparatus of Gurev does not provide for radio frequency excitation of the precursor materials evaporated therein, it cannot be utilized to promote the recombination of species of evaporated precursor materials which have disproportionated. Further, there is no reason present in that or other patents and literature for modifying the system of Gurev to use the radio frequency energy field to activate both the reactant gas and the precursor materials. Therefore, the method and apparatus described and suggested by Gurev is limited in utility to low deposition rate processes.

Accordingly, there exists a further need for an electron beam vaporized, activated reactive evaporation process in which the vaporized precursor material, as well as the reactant gases introduced into the apparatus, are excited by a radio frequency-type plasma to facilitate the reaction and/or recombination of the reactant gases and vaporized precursor material, which process is not dependent upon secondary electrons for generation and maintenance of the plasma. The instant invention fulfills these needs insofar as it provides for a plasma activated evaporation process in which the reaction rate of evaporating species is independent of the evaporation rate and/or temperature thereof, and in which the reaction of the evaporated species occurs remote from the substrate. The instant invention thus may be utilized in the preparation of thin films from an unlimited variety of materials (regardless of evaporation temperatures of the precursor materials and/or desired rates of deposition. Accordingly, the instant invention is especially well suited for the rapid deposition of thin films as a step in the fabrication of electronic devices such as integrated circuits, memory arrays, MOS transistors, photovoltaic devices and the like, without deleteriously effecting previously deposited semiconductor material or other low melting point electronic materials.

The method of the instant invention has particular utility in the preparation of photovoltaic devices such as solar cells fabricated from thin film layers of amorphous semiconductor material. Said method may be advantageously employed to deposit electrodes of a transparent electrically conductive oxide (TCO) material, such as indium tin oxide or tin oxide, upon said thin film layers of semiconductor material, such as the silicon and germanium alloys of the photovoltaic devices. The method of the instant invention may likewise be employed to deposit thin films of highly resistive materials, such as silicon oxides, silicon nitrides, cermets, etc. for use as barrier layers, protective layers, anti-reflective coatings, etc., in electronic, semiconductor and photoresponsive devices.

It should therefore be apparent that the instant invention is specifically adapted for use in the manufacture of any type of thin film device, and has special utility in the fabrication of large area photovoltaic cells which incorporate thin film layers of amorphous semiconductor alloys. Through the judicious use of the present process, the previously deposited amorphous semiconductor alloy layers are not crystallized, despite the subsequent deposition of a thin film electrode layer, which previously could only be accomplished at high temperatures.

Recently, considerable efforts have been made to develop systems for depositing amorphous semiconductor alloy materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous," as used herein, includes all materials or alloys which have long range disorder, although they may have short or intermediate range order or even contain, at times, crystalline inclusions.

It is now possible to prepare amorphous silicon alloys by glow discharge deposition or other vacuum deposition techniques, said alloys possessing (1) acceptable concentrations of localized states in the energy gaps thereof, and (2) high quality electronic properties. Such techniques are fully described in U.S. Pat. No. 4,226,898, entitled "Amorphous Semiconductors Equivalent To Crystalline Semiconductors," issued to Stanford R. Ovshinsky and Arun Madan on Oct. 7, 1980; U.S. Pat. No. 4,217,374 of Stanford R. Ovshinsky and Masatsugu Izu, which issued on Aug. 12, 1980, also entitled "Amorphous Semiconductors Equivalent To Crystalline Semiconductors"; and U.S. Pat. application Ser. No. 423,424 of Stanford R. Ovshinsky, David D. Allred, Lee Walter, and Stephen J. Hudgens entitled "Method Of Making Amorphous Semiconductor Alloys And Devices Using Microwave Energy." As disclosed in these patents and application, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in U.S. Pat. No. 4,400,409 for "A Method of Making P-Doped Silicon Films"; U.S. Pat. No. 4,410,588 for "Continuous Amorphous Solar Cell Production System," and in pending patent applications: Ser. No. 44,386, filed Mar. 16, 1981, for "Continuous Systems For Depositing Amorphous Semiconductor Material"; Ser. No. 306,146, filed Sept. 28, 1981, for "Multiple Chamber Deposition And Isolation System And Method"; Ser. No. 359,825, filed Mar. 19, 1982 for "Method And Apparatus For Continuously Producing Tandem Amorphous Photovoltaic Cells"; and Ser. No. 460,629 filed Jan. 24, 1983 for "Method And Apparatus For Continuously Producing Tandem Amorphous Photovoltaic Cells." As disclosed in these patents and patent applications, a substrate may be continuously advanced through a succession of deposition chambers, wherein each chamber is dedicated to the deposition of a specific semiconductor material. In making a photovoltaic device of p-i-n type configurations, the first chamber is dedicated for the deposition of a p-type semiconductor alloy, the second chamber is dedicated for the deposition of an intrinsic amorphous semiconductor alloy, and the third chamber is dedicated for the deposition of an n-type semiconductor alloy.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained. It is for the production of large area photovoltaic cells fabricated from the materials and by the processes enumerated hereinabove, inter alia, that the radio frequency activated electron beam evaporation method and apparatus of the instant invention may be utilized. Employing the techniques referred to in the patents and patent applications referenced above, and the teachings of the instant invention, a novel process for depositing thin film layers as a step in the manufacture of large area photovoltaic cells is disclosed.

These and other objects and advantages of the instant invention will become clear from the drawings, the detailed decription of the invention and the claims which follow.

BRIEF SUMMARY OF THE INVENTION

In accordance with the principles of the instant invention, there is disclosed herein an improved method of and apparatus for depositing thin films onto a substrate utilizing a plasma activated, electron beam evaporation process. The method includes the steps of: vacuumizing a deposition chamber; providing a substrate in the chamber; providing a supply of solid vaporizable material in the chamber; heating the solid material with electron beam means so as to vaporize said material thereof, in a vapor zone formed between the substrate and the supply of solid material; disposing electrode means proximate the vapor zone, said electrode means in electrical communication with a source of electromagnetic energy; providing an ionizable gas; activating the source of electromagnetic energy so as to energize the electrode means and develop an ionized plasma from at least the ionizable gas, said plasma developed in a plasma region formed proximate the electrode means, whereby the vaporized solid material is adapted to be activated by the plasma and deposited as a thin film onto the substrate. Also, in keeping with the method of the instant invention, a reactive gas may be introduced into the chamber proximate the plasma region. The reactive gas thus introduced is activated in the plasma region so as to react with the activated vapor of the solid material for depositing the thin film onto the substrate. Note that in the preferred embodiment, it is desirable to heat the substrate from about room temperature to 300° C. for promoting the formation of the deposited thin films thereupon. The method may be readily adapted for continuous deposition by continuously advancing the substrate through the chamber while the thin film is being deposited thereupon.

There is also disclosed herewith, apparatus for depositing a thin film onto a substrate via the plasma activated electron beam evaporation process of the instant invention. The apparatus includes: a vacuum chamber; means for vacuumizing the chamber; a substrate; a supply of solid precursor vaporizable material operatively disposed in the vacuum chamber; electron beam means adapted to vaporize the solid material in a vapor zone formed between the substrate and the supply of solid material; a source of ionizable gas; electrode means disposed proximate the source of solid material in the vapor zone, said electrode means adapted to develop an ionized plasma from at least the ionizable gas, said plasma developed in a plasma region formed proximate the electrode means; and, a source of electromagnetic energy operatively disposed in electrical communication with the electrode means, whereby activating the energy source developes the plasma and the plasma activates the vaporized solid material for the deposition of the activated reacted vaporized material as a thin film onto the substrate. Also disclosed, is an electrode assembly specifically configured so as to restrict the formation of an ionized plasma to a plasma region proximate that electrode assembly. In a preferred embodiment, the electrode assembly comprises a plurality of electrically conductive plates disposed in spaced relation. The middle plate is electrically energized to form the plasma, while the second and third plates are groundedly disposed on either side thereof and at a distance less then the dark space distance for a plasma to be formed therebetween. All three electrode plates have generally circular apertures which are operatively aligned so as to form a passageway therethrough. The aperture of the middle plate is slightly smaller then those of the contiguous second and third plates, thereby spatially restricting the formation of a plasma to the region of the apertures. Also disclosed is an alternative electrode embodiment in which all three apertures are of the same size, but the aperture of the middle plate is bridged by an electrically conductive member such as a rod, wire, or mesh. There is further disclosed an embodiment of the electrode assembly in which the aperture of the middle plate is configured to include inward projecting portions, such as for example, the points of a star.

Regardless of the configuration of the electrode, the instant invention provides a rapid, economical, easily controlled process for the deposition of thin films of a wide variety of materials by promoting the reaction and/or the recombination of evaporated and ionized species at a rate independent of the rate of evaporation. Additionally, the instant invention provides for the deposition of thin films through a process which does not deleteriously affect either the substrate or the layers of material previously deposited upon the substrate. Accordingly, the disclosed process is specifically adapted for the deposition of transparent conductive oxide films, such as indium tin oxide (ITO) and tin oxide, onto amorphous semiconductor layers as a step in the preparation of thin film amorphous semiconductor alloy devices. Further, the process of the instant invention is also well adapted for the deposition of thin films of insulating material, such as oxides and nitrides, as well as thin films of semiconductor material, such as cadmium sulfide, or silicon, onto a variety of high and low melting point substrates.

DETAILED DESCRIPTION OF THE DRAWINGS

I. The Photovoltaic Device

Figure 1:
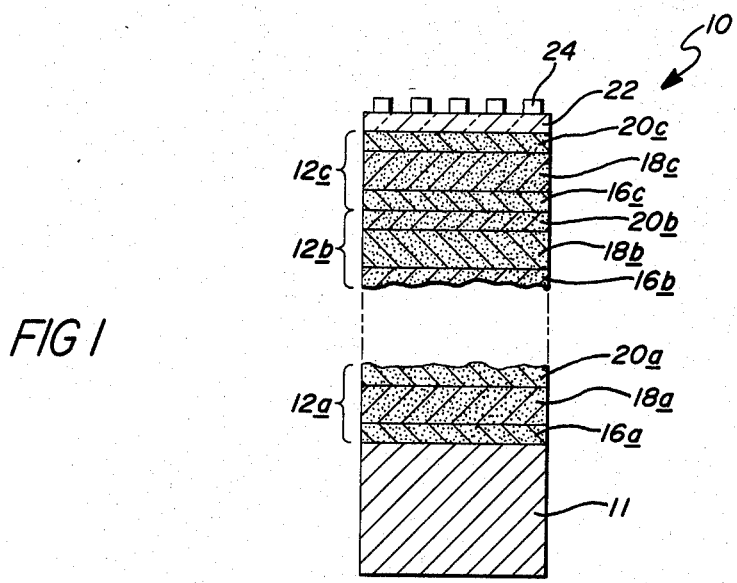
FIG. 1 is a fragmentary, cross-sectional view of a stacked photovoltaic device comprising a plurality of p-i-n type cells, each layer of the cells formed, in the preferred embodiment, from an amorphous semiconductor alloy, the device including a transparent conductive oxide top electrode layer formed according to the principles of the instant invention.

Referring now to the drawings and particularly to FIG. 1, a photovoltaic cell formed of a plurality of successive p-i-n layers, each of which include a semiconductor alloy, is shown generally by the numeral 10. The radio frequency activated, electron beam evaporation method and apparatus of the instant invention is specifically adapted for use in the fabrication of photovoltaic cells of this type.

More particularly, FIG. 1 shows a p-i-n type photovoltaic device such as a solar cell made up of individual p-i-n type cells 12a, 12b and 12c. Below the lowermost cell 12a is a substrate 11, which (1) forms the second surface of the cell 10, (2) functions as the bottom electrode, and (3) may be transparent or formed from a metallic material such as stainless steel, aluminum, tantalum, molybdenum or chromium, with or without an insulating layer thereon, or an insulating material such as glass with or without metallic particles embedded therein. Although certain applications may require a thin conductive oxide layer and/or a thin, resistive barrier layer, and/or a series of base contacts prior to deposition of the semiconductor material, for purposes of this application, the term, "substrate" shall include not only a flexible film, but also any elements added thereto by preliminary processing. The instant invention provides, inter alia, a method for depositing these elements, as will become apparent from the description which follows.

Each of the cells, 12a, 12b and 12c are fabricated with an amorphous semiconductor body containing at least a silicon or germanium alloy. Each of the semiconductor bodies includes an n-type conductivity semiconductor layer 20a, 20b and 20c; an intrinsic semiconductor layer 18a, 18b, and 18c; and a p-type conductivity semiconductor layer 16a, 16b, and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers and in accord with the principles of the instant invention, a further deposition process may be either performed in a separate environment or as a part of a continuous process. In this step, a TCO layer 22, formed in the preferred embodiment of indium tin oxide, also referred to herein as the top or upper electrode or first surface of the device 10, is deposited atop the semiconductor material. A metallic pattern in the form of an electrode grid 24 may also be applied to the device where the cell is of a sufficiently large area, or if the conductivity of the TCO layer 22 is insufficient. The grid 24 shortens the carrier path through the TCO and thus increases the conduction efficiency. The instant invention is specifically directed toward methods for the fabrication of, inter alia, the TCO layer 22, metallic patterns, such as the grid 24, or other like thin film deposits as a step in the fabrication of semiconductor devices.

While the cell illustrated in FIG. 1 is a stacked assembly of p-i-n type photovoltaic cells, the instant invention also has utility in the fabrication of other electronic devices such as single p-i-n cells, stacked or single n-i-p cells, p-n cells, Schottky barrier cells, transistors, diodes, integrated circuits, photodetectors, and other semiconductor devices; as well as any other application requiring the deposition of a thin film of material, such as the manufacture of interference filters, the preparation of optical coatings, etc.

II. Apparatus for the Plasma Assisted Evaporation Process

Figure 2:
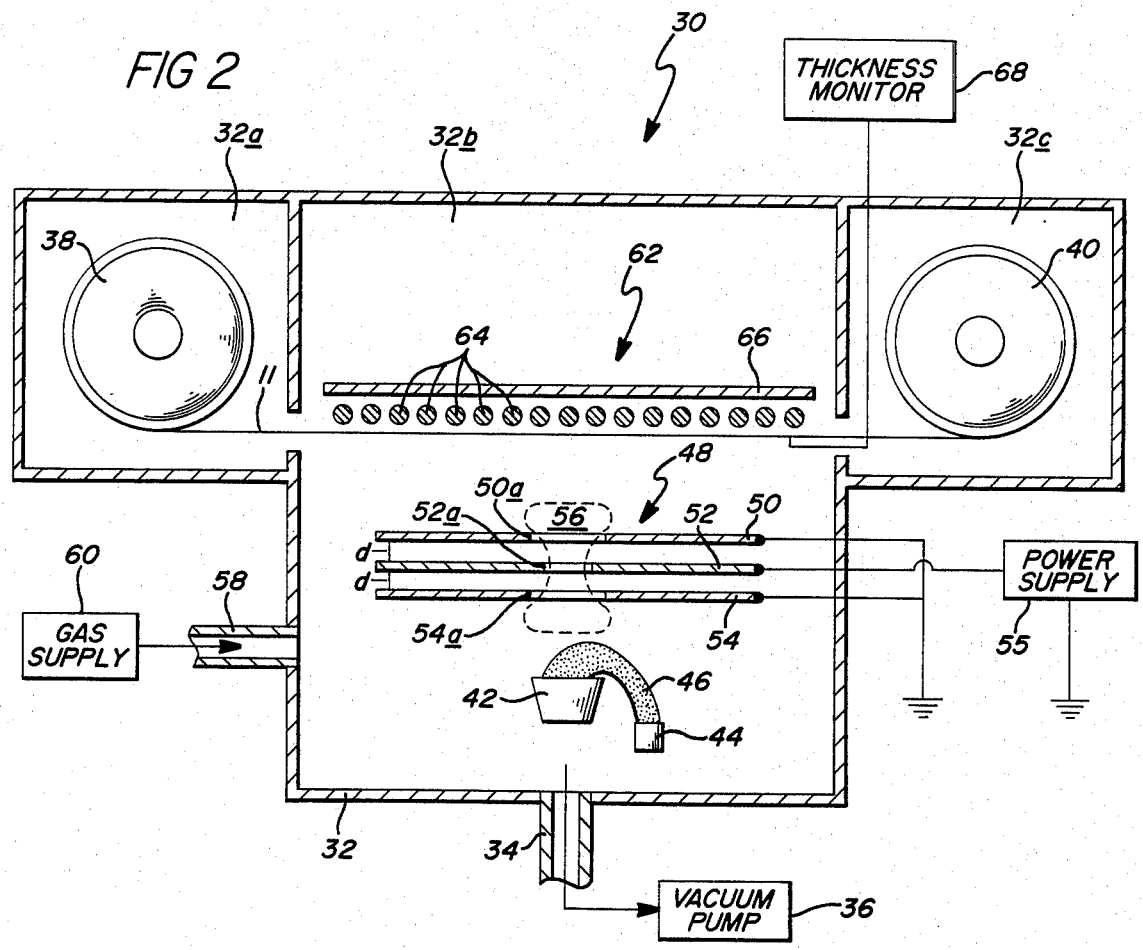
FIG. 2 is a cross-sectional view illustrating one preferred embodiment of the apparatus for depositing the thin film electrode of FIG. 1 onto a continuously moving substrate.

Turning now to FIG. 2, one preferred embodiment of an apparatus, structured in accordance with the principles of the instant invention, and specifically adapted to deposit a thin film of material, such as indium tin oxide or tin oxide, in a plasma assisted electron beam reactive evaporation process is indicated generally by the reference numeral 30. The deposition apparatus 30 includes a vacuum deposition chamber 32. The existing atmosphere within the vacuum chamber 32 is adapted for evacuation through an evacuation conduit 34 by means of a vacuum pump 36.

The vacuum chamber 32 is divided into three operatively communicating regions: the substrate supply region 32a, the deposition region 32b and the substrate take-up region 32c. The substrate supply region 32a houses a supply roll 38 which has an elongated web of substrate material 11 wound thereabout and the substrate take-up chamber 32c has a substrate take-up roller 40, about which the web of substrate material 11 is to be wound. The elongated web of substrate material 11 extends from the substrate supply reel 38 through the deposition region 32b and into the substrate take-up region 32c where it is wound about the substrate take-up roller 40. The substrate take-up roller 40, and preferably the substrate supply roller 38, are driven by motors (not illustrated) which cooperate to continuously advance the web of substrate material 11 through the deposition region 32b.

The solid precursor material is operatively disposed in, and is vaporized from a source such as a crucible 42. A source of electron beam energy 44 provides an energetic beam of electrons, indicated by reference numeral 46, which beam is focused and directed to impinge upon the precursor material in the crucible 42 by means of well known bending magnets or coils (not shown) associated therewith. The solid precursor material in the crucible 42 is maintained at a positive potential relative to the electron beam 46, which is adapted to energetically impinge upon the solid material to heat same to at least the vaporization temperature thereof. By controlling the number and kinetic energy of electrons in the beam 46, the rate of evaporation of the solid precursor material from the crucible 42 may be controlled. Note that other embodiments of electron beam heated sources of precursor material may be employed without departing from the spirit and scope of the instant invention. For example, precursor material operatively disposed in a single crucible may be vaporized by multiple electron beams; or, multiple crucibles and multiple electron beams may be employed to evaporate precursor materials having different melting points. As a further alternative, a single electron beam may be rapidly switched between several crucibles to vaporize the precursor material therewithin. There are numerous varieties of electron beam heated sources of precursor material commercially available, and it should be apparent that the instant invention is adapted to be practiced with any of such commercially available electron beam heated sources of precursor material.

Disposed in the vapor region defined between the substrate 11 and the electron beam heated crucible 42 is the electrode assembly 48. It is this electrode assembly 48 which provides the plasma activating energy, in the form of electromagnetic energy, to the vaporized precursor material operatively disposed in the crucible 42 and to the reactant gas introduced into the chamber 32. The electrode assembly 48 comprises three electrically conductive plates 50, 52 and 54 vertically spaced from one another by a distance "d". Each of the conductive plates 50, 52 and 54 includes a central opening 50a, 52a and 54a, respectively, formed therethrough. The plates 50, 52 and 54 are generally horizontally oriented so as to assume a generally parallel relationship in which the central openings, 50a, 52a and 54a are generally vertically aligned. The uppermost plate 50 and the lowermost plate 54 are both electrically grounded, while the central plate 52 is an electromagnetically energized cathode operatively disposed in electrical communication with a power supply 55, such as an alternating current power supply, a radio frequency (13.56 mHz) generator, a microwave generator, or a d.c. power supply.

The electrode assembly 48 is specifically structured so as to restrict the formation and configuration of the activating plasma to a relatively small region 56 (indicated in FIG. 2 in phantom outline) proximate the central openings 50a, 52a and 54a in the conductive plates, 50, 52 and 54, respectively, for limiting ionic bombardment of the proximately disposed substrate 11. In this manner, damage to the semiconductor layers and the like previously deposited upon the substrate is substantially prevented. Toward this end, it will be noted that the distance d separating each of the conductive plates 50 and 52 and 52 and 54 is chosen to be less than the cathode dark space distance of the central plate 52 taking into account the electromagnetic energy with which said central plate is energized by the power supply 55. It is in this manner that formation of an ionized plasma between the planar surfaces of the contiguous conductive plates is prevented. It will be noted from a careful inspection of the electrode assembly 48 that the central opening 52a in the central plate 52 is of slightly smaller dimension than the dimension of the openings 50a and 54a in the contiguous grounded plates 50 and 54. Because of this geometrical arrangement, an ionized plasma is created and sustained in the plasma region 56, proximate the central apertures 50a, 52a and 54a, substantially as defined by the aforementioned phantom outline. This particular feature of the electrode assembly 48 will be discussed hereinbelow in greater detail with particular reference to the enlarged perspective view of the electrode assembly illustrated in FIGS. 3A and 3B.

Vapors of the precursor solid material from the crucible 42 which pass through the plasma region 56 will be activated to thereby enhance the chemical reaction rates thereof. The reactive evaporation apparatus 30 is also equipped with a reactant gas inlet 58 from which reactant gas is introduced from a gas supply source 60 into the interior of the deposition region 32b of the vacuum chamber. The reactant gas inlet 58 is specifically oriented so as to direct the reactant gas toward the plasma region 56 for the aforementioned activation thereof.

In this manner, gaseous reactant materials, such as oxygen, nitrogen, hydrogen, ammonia, hydrogen-sulfide, nitrous oxide, carbon tetrafluoride etc., may be introduced into the evaporation apparatus 30 for activation by the electrode assembly 48 so as to combine with the evaporated precursor material from the crucible 42 to produce a new compound which is then deposited onto the deposition surface of the proximately disposed substrate 11. The evaporation apparatus 30 may preferably further be equipped with ancillary deposition-promoting equipment, such as a substrate heater 62 for maintaining the web of substrate material 11 at an elevated temperature so as to facilitate the deposition of the thin film of the new compound upon the deposition surface thereof. The substrate heater 62 may comprise, for example, a plurality of radiant heating lamps 64 and an associated radiant heat reflector 66. The evaporation apparatus 30 also preferably includes a thickness monitor 68, such as an optical or piezoelectric monitoring device, operatively disposed so as to measure the thickness of the thin film deposited upon the web of substrate material 11 as the web passes through the deposition chamber 32b of the evaporation apparatus.

Operation of the evaporation apparatus 30 illustrated in FIG. 2 will be explained with reference to the deposition of a thin film of indium tin oxide onto a web of stainless steel substrate material 11 having a body of amorphous silicon semiconductor material deposited thereupon. The deposition of said indium tin oxide film represents one of the final steps in the fabrication of the amorphous silicon photovoltaic device generally illustrated in and described with reference to FIG. 1. However, it must be stressed that the evaporation apparatus 30 and the corresponding method may be employed with equal advantage to deposit various other materials upon a variety of metallic or plastic, insulating or conducting, high or low melting point substrates.

Returning now to the operation of the apparatus 30, the web of substrate material 11 is threaded through the deposition apparatus 30 from the supply roll 38 in the supply chamber 32a through the evaporation chamber 32b, and to the take-up roll 40 in the take-up chamber 32c. A solid metallic precursor material comprising 85 atomic percent indium and 15 atomic percent tin is operatively disposed within the crucible 42. The deposition apparatus 30 is then sealed to the atmosphere, evacuated to a pressure of about $10^{-5}$ torr, and back filled with oxygen, the reactant gas, to return the pressure to about $10^{-3}$ torr (the oxygen gas introduced via gas inlet 58 into the immediate vicinity of the electrode assembly 48). The supply of electromagnetic energy 55 is energized to provide a radio frequency signal of 13.56 megahertz and a power of about 100 watts to the central cathode plate 52, thereby resulting in the formation of a plasma of ionized oxygen in the plasma region 56. The heater assembly 62 is energized and adjusted to maintain the web of substrate material 11 passing through the evaporation chamber 32b at a temperature within the range of approximately 150° C. to 300° C. The electron beam source 44 may now be energized for the evaporation of the indium tin precursor material. The vapors of the solid indium and tin metallic materials which diffuse into the plasma region 56 are activated by the oxygen ions therein, and react with the oxygen gas therepresent to produce the desired indium-tin oxide compound which is subsequently deposited as a thin film onto the proximately disposed and continuously advancing web of substrate material 11. During the course of the evaporation operation, the gas supply 60 and the vacuum pump 36 are regulated so as to maintain the desired constant back pressure of approximately $10^{-3}$ torr of oxygen gas within the deposition apparatus 30. The thin indium tin oxide film can be deposited onto the deposition surface of the substrate to (1) a thickness of about 600 angstroms, (2) exhibit a sheet resistance of about 30-40 ohms per square, and (3) exhibit a transmission of light (integrated average percent from about 4000 angstroms to 8000 angstroms) of greater than 90 percent when deposited upon glass.

The process described in the preceding paragraphs could be similarly adapted to deposit other precursor materials by operatively disposing a different precursor material into the crucible 42 and introducing into the evaporation apparatus 30 either (1) a different reactant gas or (2) an inert gas, from the gas supply 60. Obviously, while a moving web of substrate material represents the preferred embodiment, a moving web is not descriptive of the instant invention and the instant invention is equally applicable to a batch evaporation process which uses stationary sheets of substrate material. Similarly, the electromagnetic energy supplied to the electrode assembly 48, of a different frequency, or even of direct current, could be employed to generate the activating plasma. The broader concept desired to be covered herein is the use of an electron beam in combination with an activated reactive evaporation process for the deposition of thin films of both high and low melting point precursor materials.

III. The Electrode Assembly

Figure 3A:
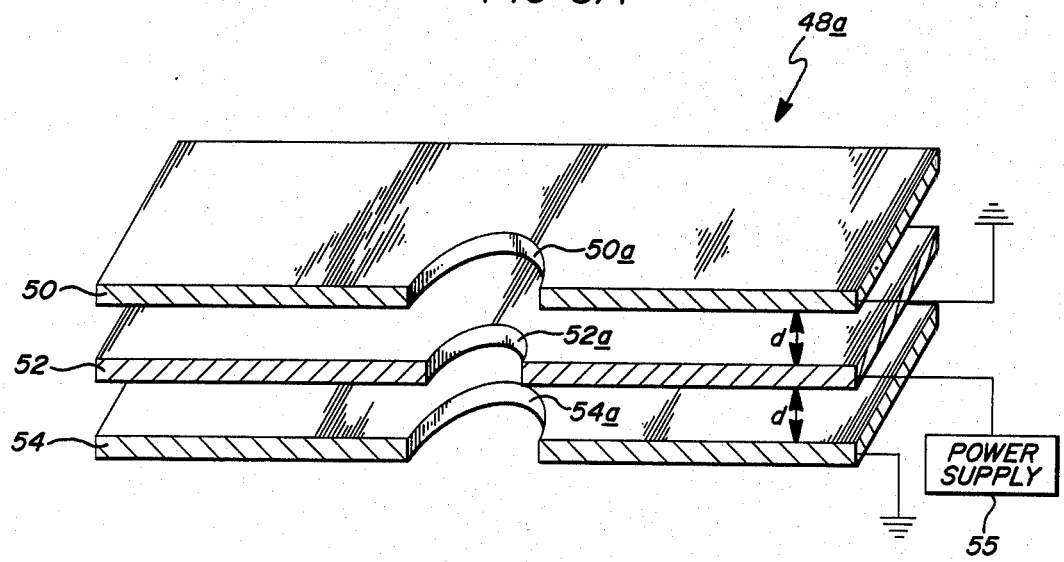
FIG. 3A is a fragmentary, cross-sectional, perspective view of one preferred electrode assembly adapted for use in the practice of the instant invention, and configured to develop a plasma region proximate thereto.
Figure 3B:
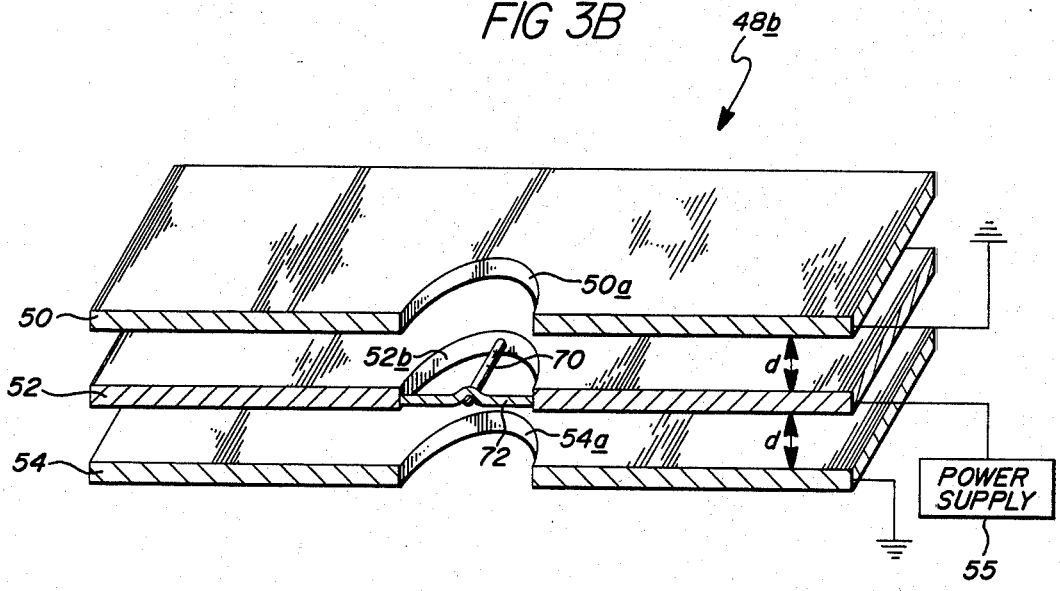
FIG. 3B is a fragmentary, cross-sectional, perspective view of a second preferred electrode assembly, similar to the assembly of FIG. 3A, and adapted for use in the practice of the instant invention, and configured to develop a plasma region proximate thereto.

FIGS. 3A and 3B illustrate fragmentary, cross-sectional, perspective views of two similar embodiments of the electrode assembly 48 which generates the ionized plasma in the process described by the instant invention. Referring first to FIG. 3A, a first electrode assembly, generally similar to that depicted in and described with reference to the deposition apparatus 30 of FIG. 2, is shown generally by the reference numeral 48a. The electrode assembly 48a comprises three generally planar, generally horizontally disposed, and generally parallel plates 50, 52, 54, formed of an electrically conductive material such as aluminum or stainless steel. It will be noted that each of the conductive plates includes a generally circular aperture 50a, 52a and 54a, respectively, formed through the central portion thereof, and that these apertures are vertically aligned, that is to say, apertures 50a, 52a and 54a enjoy a common central axis.

In operation, electromagnetic energy is provided to the central conductive plate 52 of the electrode assembly 48a from a power supply 55, while the top and bottom conductive plates 50 and 54 are grounded. Owing to the particular geometric configuration of the electrode assembly 48a, the electromagnetic field establishes a plasma region (indicated by reference numeral 56 in FIG. 2) which extends through the apertures in the conductive plates. The plates 50, 52 and 54 are spaced from one another by a distance d which is less than the dark space distance for an electrode operating at the frequency and in the pressure regime in which the electrode assembly 48a is specifically adapted to operate. For purposes of the present invention, dark space shall be defined as that region of a glow discharge immediately adjacent the electrode in which little or no plasma discharge is produced. Therefore, by separating the conductive plates, 50, 52 and 54, the distance d, which is less than the dark space distance, there will be no plasma formation in the regions therebetween. It will further be noted that the aperture 52a in the central conductive plate 52 is of a smaller diameter than are the apertures 50a and 54a in the contiguous grounded plates 50 and 54 disposed, respectively, thereabove and therebelow. By forming the aperture 52a in the central conductive plate 52 somewhat smaller than those in the grounded plates 50 and 54, a plasma in the region extending through the apertures is generated. This is noteworthy because it has been found that a very weak plasma, or no plasma at all, is generated when all of the apertures are uniformly sized.

FIG. 3B illustrates a second embodiment of the electrode assembly, the FIG. 3B embodiment generally indicated by the reference numeral 48b, configured in accordance wtih the principles of the instant invention. As described with reference to the previous figure, the electrode assembly 48b comprises three electrically conductive, generally parallel, generally planar plates; a central conductive plate 52 and two electrically grounded conductive plates 50 and 54 operatively disposed on opposite sides thereof. As previously discussed, the conductive plates 50, 52 and 54 are separated by a distance d which is less than the dark space distance therebetween. Since the conductive plates of FIG. 3B are similar in structure and function to the conductive plates previously described in FIG. 3A and FIG. 2, similar reference numerals have been assigned thereto.

As in the previously discussed embodiment, each of the conductive plates 50, 52 and 54 have a central, generally circular, generally vertically aligned aperture 50a, 52a and 54a, respectively, formed therethrough. In contradistinction to the electrode assembly 48a of FIG. 3A, the apertures 50a, 52b and 54a in the conductive plates 50, 52 and 54 which form the electrode assembly 48b of FIG. b, are all of approximately the same diameter. However, a pair of crossed, substantially perpendicular, electrically conductive wires 70 and 72 are operatively disposed so as to extend across the aperture 52b of the charged central plate 52 for generating a plasma region which extends through those aligned apertures. In this manner, the crossed conductive wires 70 and 72 function in substantially the same manner as the small central aperature 52a, present in the central plate 52 of the assembly 48a of FIG. 3A, functioned. Although not shown, the formation and configuration of the plasma region 56 may similarly be facilitated by the use of an electrically conductive wire grid or wire mesh which would be formed to extend across the aperture of the central conductive plate 52. Other aperture configurations may be similarly employed to establish and limit the configuration of the plasma region to the immediate vicinity of the apertures; for example, the central conductive plate 52 may be fabricated with a star shaped aperture therein, the inward projecting portions thereof sustaining the plasma formation.

The foregoing description and example are merely illustrative of the utility of the instant invention, and are not intended as limitations thereon. It is the claims which follow, including all equivalents, which define the scope of the invention.

What is claimed is:

1. An improved method of depositing a thin film onto a substrate, said method including the steps of:
   vacuumizing a chamber;
   providing an electrically unbiased substrate in the chamber;
   providing a supply of solid vaporizable material in the chamber;
   heating the solid material with electron beam means so as to vaporize said material in a vapor zone formed between the substrate and the supply of solid material;
   disposing electrode means in the vapor zone, said electrode means operatively disposed in electrical communication with a source of alternating current;
   providing an ionizable gas; and,
   activating the source of alternating current so as to energize the electrode means and develop an ionized plasma from at least the ionized gas, said ionized plasma developed in a plasma region formed proximate the electrode means; whereby the vaporized solid material is activated by the plasma and deposited as a thin film onto the substrate.

2. A method as in claim 1, including the further steps of:

introducing a reactive gas proximate the plasma region; and activating the reactive gas in the plasma region, whereby the activated gas and the reactive vapor of the solid material react for the deposition thereof as a thin film.

3. A method as in claim 1, including the further step of: maintaining the substrate at a temperature of about room temperature to 300° C. during the deposition of the thin film thereonto.

4. A method as in claim 1, including the further step of: selecting the solid material from the group consisting essentially of: In, Sn, Cd, Zn, Ti, Si, Ge and mixtures thereof.

5. A method as in claim 2, including the further step of: selecting the reactive gas from the group consisting essentially of: $O_2$, $N_2$, $NH_3$, $CH_4$, $H_2S$ $N_2O$, $CF_4$ and mixtures thereof.

6. A method as in claim 1, wherein the step of energizing the electrode means with alternating current comprises: energizing the electrode means with radio frequency energy.

7. A method as in claim 1, wherein the step of energizing the electrode means with alternating current comprises: energizing the electrode means with microwave energy.

8. A method as in claim 1, including the further step of: maintaining the pressure within the chamber in the range of $10^{-2}-10^{-4}$ torr.

9. A method as in claim 1, including the further step of: continuously advancing the substrate through the chamber, whereby a thin film is continuously deposited upon the advancing substrate.

10. A method as in claim 2, wherein:
the step of heating the solid vaporizable material with electron beam means comprises the heating of an indium:tin alloy;
the step of introducing a reactive gas comprises the introduction of oxygen; and
the method includes the further step of maintaining the substrate at a temperature from about room temperature to 300° C.

11. A method as in claim 2, wherein:
the step of heating the solid vaporizable material comprises heating indium with electron beam means;
the step of introducing a reactive gas comprises the introduction of oxygen; and
the method includes the further step of maintaining the substrate at a temperature of up to 300° C.

12. A method as in claim 1, wherein the substrate in the chamber includes a body of semiconductor material thereupon.

13. A method as in claim 1, wherein the substrate in the chamber includes having a plurality of amorphous semiconductor layers thereupon.

14. Apparatus for depositing a thin film onto a substrate, said apparatus including:
a vacuum chamber;
means for vacuumizing the chamber;
means for supporting an electrically unbiased substrate;
a source of solid vaporizable material operatively disposed in the vacuum chamber;
electron beam means adapted to vaporize the solid material in a vapor zone formed between the substrate and the supply of solid material;
a source of ionizable gas;
electrode means operatively disposed proximate the source of solid material in the vapor zone; said electrode means adapted to develop an ionized plasma from at least the ionizable gas, said plasma developed in a plasma region formed proximate the electrode means; and
a source of alternating current operatively disposed in electrical communication with the electrode means, whereby activating the source develops the plasma and the plasma activates the vaporized solid material for the deposition thereof as a thin film onto the substrate.

15. Apparatus as in claim 14, further including:
gas inlet means adapted to introduce a reactive gas proximate the plasma region, whereby the reactive gas and activated vapor of the solid material react to deposit the thin film onto the substrate.

16. Apparatus as in claim 14, further including:
means for heating the substrate to a temperature from about room temperature to 300° C. during the deposition of the thin film thereonto.

17. Apparatus as in claim 14, further including:
means adapted to continuously move the substrate through the chamber at a preselected rate of speed, whereby a thin film of preselected thickness may be continuously deposited onto the substrate.

18. Apparatus as in claim 14, further including:
thickness monitoring means for measuring the thickness of the thin film as it is deposited.

19. Apparatus as in claim 14, further including:
a first crucible in which the source of solid material is disposed; and
control means adapted to (1) control the energy and intensity of the electron beam means, and (2) direct the electron beam means to impinge upon the solid material in the crucible for the vaporization thereof.

20. Apparatus as in claim 19, further including:
at least two crucibles in each of which the source of solid material is disposed; and
said control means is further adapted to direct the electron beam means to sequentially impinge upon the material in each of the crucibles.

21. Apparatus as in claim 14, wherein the electrode means comprises:
a first generally planar metallic plate having an aperture formed therein;
a second generally planar metallic plate disposed in spaced relation to a first surface of said first plate and having an aperture formed therein; and
a third generally planar metallic plate disposed in spaced relation to the second surface of the first generally planar plate, said third plate having an aperture formed therein, the apertures in the first, second and third plates being generally aligned.

22. Apparatus as in claim 21, wherein the first plate is in electrical communication with the source of alternating current, and the second and third plates are electrically grounded.

23. Apparatus as in claim 21, wherein the apertures in the first, second and third plates are generally circular and the aperture in the first plate has a diameter less than the diameter of the apertures in the second and third plates.

24. Apparatus as in claim 21, wherein the first metallic plate further includes a relatively thin, electrically conductive member in electrical communication therewith and extending at least partially across the aperture thereof.

25. Apparatus as in claim 21, wherein the first metallic plate further includes an electrically conductive metallic mesh extending at least partially across the aperture thereof and in electrical communication therewith.

26. Apparatus as in claim 14, wherein the source of alternating current is adapted to provide radio frequency energy.

27. Apparatus as in claim 14, wherein the source of alternating current is adapted to provide microwave energy.

28. Apparatus as in claim 14, wherein the source of solid material is adapted to provide a material selected from the group consisting essentially of: In, Sn, Cd, Zn, Ti, Si, Ge and mixtures thereof.

29. Apparatus as in claim 15, wherein the gas inlet means is adapted to provide a reactive gas selected from the group consisting essentially of: $O_2$, $N_2$, $NH_3$, $CH_4$, $H_2S$, $N_2O$, $CF_4$ and mixtures thereof.

* * * * *